(12) United States Patent
Yamanaka et al.

(10) Patent No.: US 7,605,452 B2
(45) Date of Patent: Oct. 20, 2009

(54) SEMICONDUCTOR LIGHT-EMITTING DEVICE, SEMICONDUCTOR LIGHT-EMITTING MODULE, AND METHOD OF MANUFACTURING THE SEMICONDUCTOR LIGHT-EMITTING MODULE

(75) Inventors: Toshihiro Yamanaka, Ibaraki (JP); Hiroyuki Tsukamoto, Ibaraki (JP); Kiyoharu Kishimoto, Ibaraki (JP)

(73) Assignee: Hitachi Maxell, Ltd., Osaka (JP)

( * ) Notice: Subject to any disclaimer, the term of this patent is extended or adjusted under 35 U.S.C. 154(b) by 65 days.

(21) Appl. No.: 11/519,144

(22) Filed: Sep. 12, 2006

(65) Prior Publication Data

US 2007/0080438 A1   Apr. 12, 2007

(30) Foreign Application Priority Data

Oct. 7, 2005  (JP) .............................. 2005-294886
Oct. 7, 2005  (JP) .............................. 2005-294905

(51) Int. Cl.
*H01L 23/495*  (2006.01)
*H01L 23/12*   (2006.01)

(52) U.S. Cl. .............................. 257/676; 257/E23.031; 257/E23.008; 257/E23.175; 257/E25.02; 257/E33.072; 257/685; 257/723; 257/784; 257/737

(58) Field of Classification Search ................. 257/676, 257/685, 723, 737, 784, E23.031, E23.008, 257/E23.175, E25.02, E33.072
See application file for complete search history.

(56) References Cited

U.S. PATENT DOCUMENTS

| | | | | |
|---|---|---|---|---|
| 5,643,834 | A * | 7/1997 | Harada et al. | 438/122 |
| 7,169,652 | B2 * | 1/2007 | Kimura | 438/149 |
| 7,215,403 | B2 * | 5/2007 | Kimura | 349/152 |
| 2002/0023342 | A1* | 2/2002 | Nakamura | 29/832 |
| 2004/0126911 | A1* | 7/2004 | Kimura | 438/22 |
| 2004/0214374 | A1* | 10/2004 | Sakamoto et al. | 438/113 |
| 2004/0222433 | A1* | 11/2004 | Mazzochette et al. | 257/99 |
| 2006/0055309 | A1* | 3/2006 | Ono et al. | 313/492 |
| 2008/0032142 | A1* | 2/2008 | Tasumi et al. | 428/447 |

FOREIGN PATENT DOCUMENTS

| | | | |
|---|---|---|---|
| JP | 11-4080 | * | 6/1997 |
| JP | 2003-21839 | | 1/2003 |
| JP | 2004-253328 | | 9/2004 |

* cited by examiner

*Primary Examiner*—Alexander O Williams
(74) *Attorney, Agent, or Firm*—Oliff & Berridge, PLC

(57) ABSTRACT

A semiconductor light-emitting device according to an embodiment of the present invention includes chip LEDs formed on a silicon submount, in which a wiring pattern having a chip connecting terminal portion connecting the chip LEDs, an external connecting terminal portion connecting an external unit, and a plurality of lead portions connecting a corresponding chip connecting terminal portion and a corresponding external connecting terminal portion is formed on the silicon submount, and an area of the chip connecting terminal portions is made larger than an area of a region where the chip connecting terminal portion overlaps with the chip LEDs. Accordingly, a semiconductor light-emitting device of high heat radiation property and heat resistance can be provided.

13 Claims, 13 Drawing Sheets

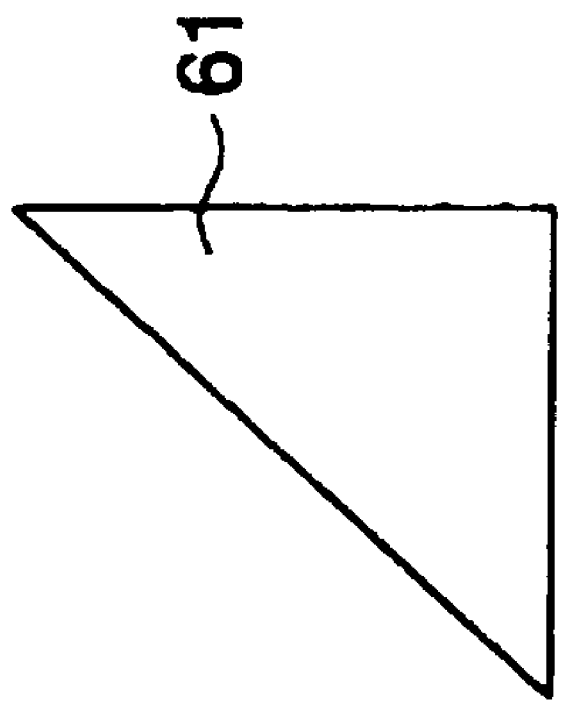
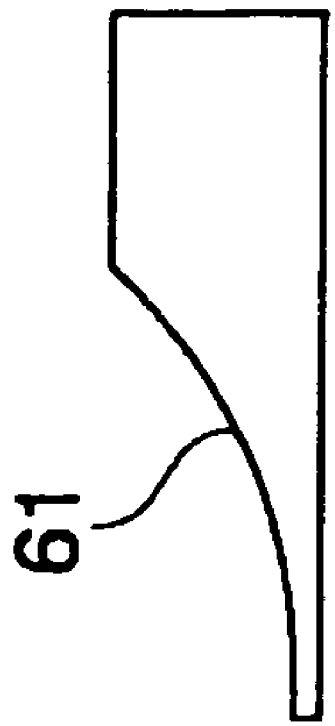
Fig. 13A
Fig. 13B

SEMICONDUCTOR LIGHT-EMITTING DEVICE, SEMICONDUCTOR LIGHT-EMITTING MODULE, AND METHOD OF MANUFACTURING THE SEMICONDUCTOR LIGHT-EMITTING MODULE

BACKGROUND OF THE INVENTION

1. Field of the Invention

The present invention relates to a semiconductor device obtained by mounting a semiconductor chip on a silicon submount, a semiconductor module, and a method of manufacturing the semiconductor module.

2. Description of Related Art

Up to now, large liquid crystal display panels have been applied to a liquid crystal display, a liquid crystal display television, or the like. In many cases, a cold-cathode tube has been used as a backlight of the display panel. In recent years, the use of the cold-cathode tube made of mercury has been avoided in order to overcome so-called RoHS for environmental protection. In addition, one of the most important technical problem of the liquid crystal display panel is how to improve a brightness of an image. From this viewpoint, in the case of using the cold-cathode tube, a color reproduction range is narrow. In particular, a green reproductivity is insufficient. Thus, the use of the cold-cathode tube is avoided.

The use of a backlight device as a substitute for the cold-cathode tube has been under study. As a backlight device example, there is a semiconductor light-emitting device mounted on a silicon submount through flip-chip bonding (for example, see Japanese Unexamined Patent Publication No. 2003-21839). In such semiconductor light-emitting devices, no hazardous material such as mercury is used, and the color reproduction range can be widened.

Further, a semiconductor module as shown in FIG. 16 has been hitherto reported (for example, see Japanese Unexamined Patent Publication No. 2004-253328). As shown in FIG. 16, a power supply voltage is applied to a first electric circuit 101 and a second electric circuit 102. A third LED-connecting electric circuit 103 is inserted between the first electric circuit 101 and the second electric circuit 102. The insulating connecting members 104 extend in the width direction and are arranged away from each other in the longitudinal direction to connect the electric circuits 101, 102, and 103. Each LED 105 is attached to each connecting member 104, and an electric connecting terminal thereof is connected with the third electric circuit 103. The electric circuits 101, 102, and 103 can be manufactured by pressing a long conductor plate such as a copper plate. Further, the connecting member 104 can be formed by insert-molding a resin material.

In the semiconductor module as disclosed in Japanese Unexamined Patent Publication No. 2004-253328, the resin-made connecting members 104 are provided at some intervals in the long electric circuits 101, 102, and 103 made up of a copper plate or the like. Hence, exposed portions of the electric circuits 101, 102, and 103 can be readily deformed, and the entire module can be processed into a desired shape. Further, since the electric circuits 101, 102, and 103 made up of the copper plate or the like are partially exposed, a heat radiation property is high, and the LEDs 105 can be prevented from being damaged due to an excessive temperature rise.

Incidentally, the LED consumes a large amount of power and thus generates a large quantity of heat. Therefore, it is necessary to take an adequate measure for heat radiation to bring this kind of semiconductor light-emitting device into practical use.

In the technique as disclosed in Japanese Unexamined Patent Publication No. 2003-21839, a heat radiating block is placed on the rear surface of the silicon submount. Thus, a measure for heat radiation is taken for the LED. However, any special measure for heat radiation is not taken as for the upper surface of the silicon submount (LED mounting surface). In this regard, there is still room for improvement. That is, the temperature of the upper surface of the silicon submount as the LED mounting surface becomes highest. Thus, it is most rational to take the measure for heat radiation for the upper surface of the LED from the viewpoint of preventing the LED from overheating. In the conventional techniques, the heat radiating block is placed only on the rear surface of the silicon submount. Any special measure for heat radiation is taken for the upper surface of the silicon submount. Accordingly, heat generated in the silicon submount cannot be efficiently released. Moreover, there is a possibility that various problems resulting from the LED overheating, for example, deteriorations in characteristics occur.

In the semiconductor module as disclosed in Japanese Unexamined Patent Publication No. 2004-253328, the electric circuits 101, 102, and 103 are manufactured by pressing copper plate or the like. At the same time, the connecting member 104 is formed by insert-molding a resin. Further, it is necessary to remove a branch that temporarily blocks a path between the electric circuits 101, 102, and 103. This causes a problem in that a manufacturing process becomes completed and the module costs high. Further, in the semiconductor module as disclosed in Japanese Unexamined Patent Publication No. 2004-253328, the exposed portions of the electric circuits 101, 102, and 103 made up of a copper plate or the like are plastic-deformed to thereby process the entire module into a desired shape. This structure has a limitation on flexibility, and thus has a problem in that its application range is narrowed.

SUMMARY OF THE INVENTION

The present invention has been accomplished in view of the above problems of the related art. It is accordingly an object of the invention to provide a semiconductor device having high heat radiation property and heat resistance, and to provide a semiconductor module of a high flexibility, which can be manufactured at low cost, and a method of manufacturing the semiconductor module.

In order to attain the above object, the present invention provides a semiconductor device, including: a silicon submount having an insulating oxide layer formed on a surface; a semiconductor chip mounted onto the silicon submount; and a predetermined wiring pattern formed on the insulating oxide layer, the wiring pattern including: a plurality of chip connecting terminal portions connecting the semiconductor chip; a plurality of external connecting terminal portions connecting an external unit; and a plurality of lead portions connecting a corresponding one of the chip connecting terminal portions and a corresponding one of the external connecting terminal portions, and an area of the chip connecting terminal portion is larger than an area of a region where the chip connecting terminal portions and the semiconductor chip overlap with each other.

According to this structure, almost all of the upper surface of the silicon submount can be covered with a wiring pattern. The wiring pattern is made of a metal material of high conductivity and heat conductivity such as copper. Thus, the wiring pattern functions as a heat radiating member of the upper surface of the silicon submount. In addition, it is possible to decrease and uniformize the temperature of the upper surface of the silicon submount. Hence, it is possible to efficiently suppress or avoid various kinds of defects resulting from the overheating of the LED.

Further, in the semiconductor device according to the present invention, an outer size of the chip connecting terminal portion is larger than an outer size of a terminal portion formed in the semiconductor chip and connected with the chip connecting terminal portion.

According to this structure, restrictions on a positioning accuracy of the semiconductor chip relative to the chip connecting terminal portion can be eased to some extent. This leads to improvements in productivity of the semiconductor device and in turn to reduction in cost of the semiconductor device.

Further, in the semiconductor device according to the present invention, an outer size of the external connecting terminal portion is made larger than an outer size of the chip connecting terminal portion.

According to this structure, restrictions on a positioning accuracy of the external unit relative to the external connecting terminal portion can be eased to some extent. This leads to improvements in productivity of the semiconductor device and in turn to reduction in cost of the semiconductor device.

Further, in the semiconductor device according to the present invention, the wiring pattern is made up of a copper-plated product.

The wiring pattern is made up of a copper-plated product has high conductivity, and thus hardly generates heat even when applied with a large amount of current, so the heat generation amount of the semiconductor device can be reduced.

Further, in the semiconductor device according to the present invention, at least one light emitting diode as the semiconductor chip and a driving circuit element of the light emitting diode are mounted on the silicon submount.

In this way, the LED and the driving circuit element of the LED can be mounted onto the silicon submount. Thus, the components of the semiconductor device can be integrated. This enables the compact and high-performance semiconductor light-emitting device.

Further, in the semiconductor device according to the present invention, at least one light emitting diode as the semiconductor chip and a protective circuit element of the light emitting diode are mounted on the silicon submount.

In this way, the LED and the protective circuit element of the LED are mounted onto the silicon submount. In this case, the components of the semiconductor device can be integrated to enable the compact and high-performance semiconductor light-emitting device. In addition, the LED can be protected against the electrostatic breakdown or the like, and a reliability of the semiconductor light-emitting device can be enhanced.

Further, in the semiconductor device including the LED according to the present invention, a red light emitting diode, a green light emitting diode, and a blue light emitting diode are mounted onto the silicon submount.

As mentioned above, a red light emitting diode, a green light emitting diode, and a blue light emitting diode can be mounted onto the silicon submount. Thus, different colors of light beams emitted from the light emitting diodes can be mixed. This makes it possible to generate white light. Hence, the LED can be used as an illuminator or a backlight of a liquid crystal display panel.

Further, in the semiconductor device according to the present invention, a radiator plate is provided on a rear surface of the silicon submount, and an area of the radiator plate is made larger than that of the silicon submount.

Thus, heat generated from the silicon submount can be efficiently released.

Further, in the semiconductor device according to the present invention, the semiconductor chip is a light emitting diode, and an optical member is provided to cover the light emitting diode for guiding light emitted from the light emitting diode to go away from the silicon submount surface where the light emitting diode is mounted, on the silicon submount surface side where the light emitting diode is mounted.

The light emitted from the LED can be efficiently guided to go away from the silicon submount surface where the light emitting diode is mounted (toward the upper surface of the silicon submount). Thus, the highly efficient use of the light is realized, and the high-luminance and power-saving device can be obtained.

Further, in the semiconductor device according to the present invention, the optical member is formed of a light transmissive material.

The light emitted from the LED can be efficiently guided to go away from the silicon submount surface where the light emitting diode is mounted (toward the upper surface of the silicon submount). Thus, the highly efficient use of the light is realized, and the high-luminance and power-saving device can be obtained.

Further, in the semiconductor device according to the present invention, the optical member includes a lens provided to the light emitting diode on the opposite side of the silicon submount, the lens has a flat surface on the silicon submount side, and the flat surface of the lens on the silicon submount side is opposite to the silicon submount surface where the light emitting diode is mounted and is substantially parallel to the silicon submount surface where the light emitting diode is mounted.

According to this structure, the flat surface of the lens on the silicon submount side and the silicon submount surface where the light emitting diode is mounted are used as position points. Thus, the components can be assembled while aligning the position or direction of the lens, and the attachment of the lens can be easily and accurately carried out.

Further, in the semiconductor device according to the present invention, a transparent resin is filled in between the flat surface of the lens on the silicon submount side and the silicon submount surface where the light emitting diode is mounted.

According to this structure, the present invention can apply to such a case that a plurality of LEDs different in height are mounted onto the silicon submount, with ease.

Further, in the semiconductor device according to the present invention, the optical member includes: a lens provided to the light emitting diode on the opposite side of the silicon submount; a cylindrical member extending from an outer peripheral portion of a surface of the lens on the silicon submount side toward the silicon submount side; a holding portion surrounded by the surface of the lens on the silicon submount side and an inner wall of the cylindrical member and housing the light emitting diode; and an abutment portion provided to a leading edge of the cylindrical member and brought into abutment against an outer peripheral portion of the light emitting diode.

In this way, the holding portion housing the light emitting diode and the abutment portion that abuts against the outer peripheral portion of the light emitting diode on the silicon submount are provided. Hence, the present invention can apply to such a case that a plurality of LEDs different in height are mounted onto the silicon submount, with ease.

In order to attain the above object, the present invention provides a the light emitting diode, including: a tape-like flexible wiring board having a predetermined conductive pattern and semiconductor device mounting hole; and a plurality of semiconductor devices placed onto the flexible wiring board and connected with the conductive pattern, in which the semiconductor device includes: a silicon submount having a predetermined wiring pattern; and one or more semiconductor chips mounted onto the silicon submount and inserted into the semiconductor device mounting hole, a surface of the silicon submount where the semiconductor chip is mounted faces one surface of the flexible wiring board, and the semiconductor chip is provided through the semiconductor device mounting hole to protrude from the other surface of the flexible printed wiring board.

The flexible wiring board is manufactured by forming a conductive pattern made of a copper foil or the like on a substrate film made of a polyimide resin or the like, and thus enables high mass productivity and can be manufactured at low cost. In addition, the flexible wiring board can be elastically deformed into a desired shape as needed. Accordingly, as compared with an electric furnace made up of a metal thin plate, the semiconductor module can be manufactured at low costs and easily processed in accordance with where the module is used.

Further, the thermal expansion coefficient of the silicon submount is approximate to that of the semiconductor chip. In particular, one or more semiconductor chips can be mounted onto the silicon submount of the semiconductor device in the semiconductor module. In this semiconductor module, defects resulting from the thermal coefficient difference between the semiconductor chip and its attachment member such as the breakdown of the semiconductor chip hardly occur, and the semiconductor chip attains high durability.

Further, the upper surface of the semiconductor chip is positioned above the upper surface of the flexible wiring board. That is, the semiconductor chip protrudes from the other surface (upper surface) of the flexible printed wiring board through the semiconductor device mounting hole. With this arrangement, in the case of adopting the LED as the semiconductor chip, the light emitted from the LED is not shielded by the flexible wiring board, so a high-luminance and power-saving illuminator can be attained.

Further, the lower surface of the silicon submount is positioned below the lower surface of the flexible wiring board. That is, the surface (upper surface) of the silicon submount where the semiconductor chip is mounted faces the other surface (lower surface) of the flexible wiring board. Therefore, the radiator plate may be provided on the rear surface of the silicon submount as needed. Thus, the semiconductor module of high heat radiation property can be easily manufactured.

Further, in the semiconductor module of the present invention, the radiator plate is attached to the surface of the silicon submount opposite to the surface where the semiconductor chip is mounted.

According to this structure, it is possible to efficiently release heat generated from the semiconductor chip such as the LED. Therefore, it is possible to efficiently avoid various kinds of defects resulting from the overheating of the semiconductor chip, such as deteriorations in characteristics.

Further, in the semiconductor module according to the present invention, the surface of the radiator plate attached to the silicon submount is fixed to the other surface of the flexible printed wiring board.

According to this structure, the flexible wiring board is securely fixed to the semiconductor device. Therefore, disconnection at the connection portion between the flexible wiring board and the semiconductor device can be prevented, and the durability of the semiconductor module is enhanced.

Further, in the semiconductor module of the present invention, the semiconductor chip is a light emitting diode, and an optical member is provided to cover the light emitting diode for efficiently guiding light emitted from the light emitting diode to go away from the silicon submount surface where the light emitting diode is mounted, on the silicon submount surface side where the light emitting diode is mounted.

The light emitted from the LED can be efficiently guided to go away from the silicon submount surface where the light emitting diode is mounted (toward the upper surface of the silicon submount). Thus, the highly efficient use of the light is realized, and the high-luminance and power-saving device can be obtained.

Meanwhile, in order to attain the above object, the present invention provides a method of manufacturing a semiconductor module, including: forming a tape-like flexible wiring board having a predetermined conductive pattern and semiconductor device mounting hole; forming a semiconductor device including a silicon submount having a predetermined wiring pattern, and one or more semiconductor chips mounted onto the silicon submount; placing the flexible wiring board such that a surface of the silicon submount where the semiconductor chip is mounted faces one surface of the flexible printed wiring board while transferring the flexible wiring board in one direction; attaching the semiconductor device such that the semiconductor chip is inserted into a semiconductor device mounting hole from the one surface side of the flexible wiring board; placing the semiconductor chip such that the semiconductor chip protrudes from the other surface of the flexible printed wiring board, through the semiconductor device mounting hole; and connecting the conductive pattern with the wiring pattern in a state where the semiconductor chip is placed.

According to this structure, the semiconductor device mounting hole is formed in the flexible wiring board. Hence, the semiconductor device can be attached such that the semiconductor chip is inserted into the semiconductor device mounting hole. This enables positional alignment of the semiconductor device relative to the flexible wiring board.

Further, the flexible wiring board is placed such that a surface of the silicon submount where the semiconductor chip is mounted faces one surface of the flexible wiring board while being transferred in one direction. The semiconductor device is mounted such that the semiconductor chip is inserted into the semiconductor device mounting hole from one surface side of the flexible wiring board. The conductive pattern on the flexible wiring board is connected with the wiring pattern on the silicon submount. Owing to such structure, the semiconductor device can be efficiently attached to the flexible wiring board.

The above and other objects, features and advantages of the present invention will become more fully understood from the detailed description given hereinbelow and the accompanying drawings which are given by way of illustration only, and thus are not to be considered as limiting the present invention.

BRIEF DESCRIPTION OF THE DRAWINGS

FIG. 13A is a side view of a mirror structure of the semiconductor module of FIG. 12;

FIG. 13B is a side view of the mirror structure of the semiconductor module of FIG. 12;

DESCRIPTION OF THE PREFERRED EMBODIMENTS

Exemplary embodiments of the present invention are described hereinafter with reference to the drawings. The description provided hereinbelow merely illustrates exemplary embodiments of the present invention, and the present invention is not limited to the below-described embodiments. The description hereinbelow is appropriately shortened and simplified to clarify the explanation. A person skilled in the art will be able to easily change, add, or modify various elements of the below-described embodiments, without departing from the scope of the present invention.

Hereinafter, an embodiment of a semiconductor device according to the present invention will be described with reference to the accompanying drawings. The following description is focused on a semiconductor light-emitting device by way of example.

Figure 1A:
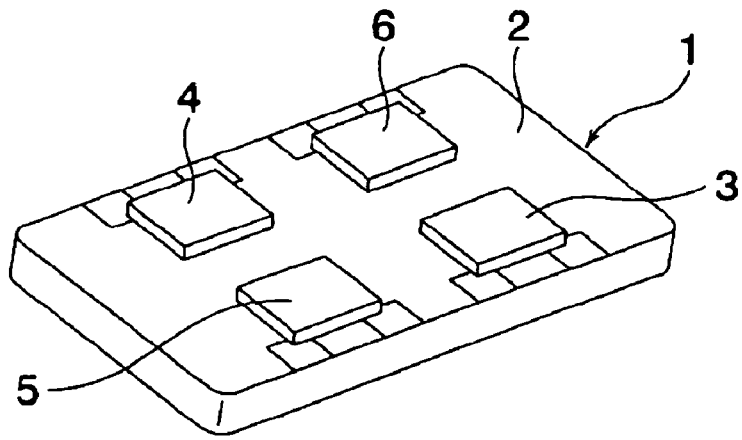
FIG. 1A is a perspective view of a semiconductor light-emitting device according to an embodiment of the present invention.
Figure 1B:
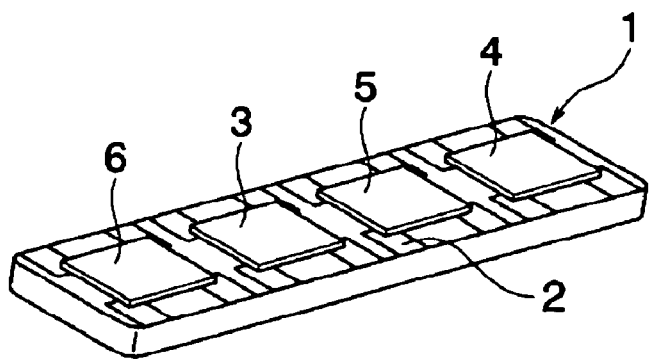
FIG. 1B is a perspective view of the semiconductor light-emitting device according to the embodiment of the present invention.
Figure 2:
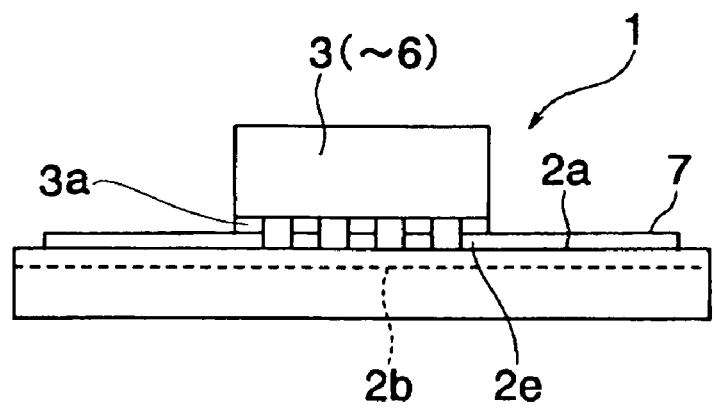
FIG. 2 is a side view of the semiconductor light-emitting device according to the embodiment of the present invention.
Figure 3A:
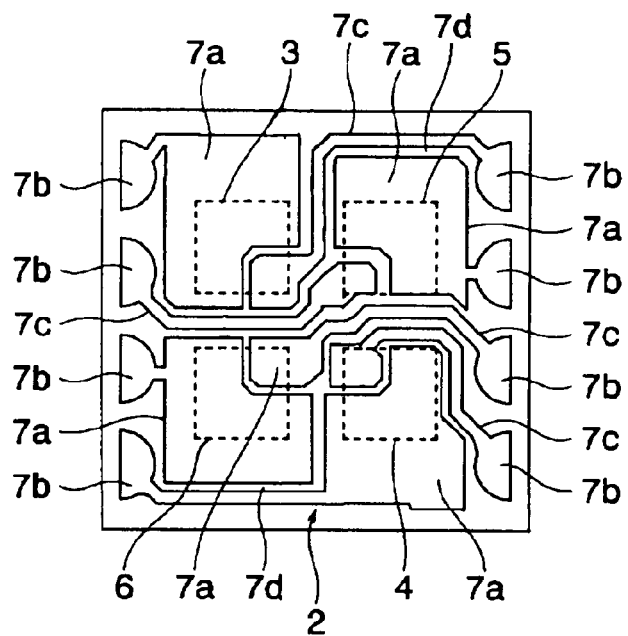
FIG. 3A is a plan view of a wiring pattern formed on a silicon submount of the semiconductor light-emitting device according to the embodiment of the present invention.
Figure 3B:
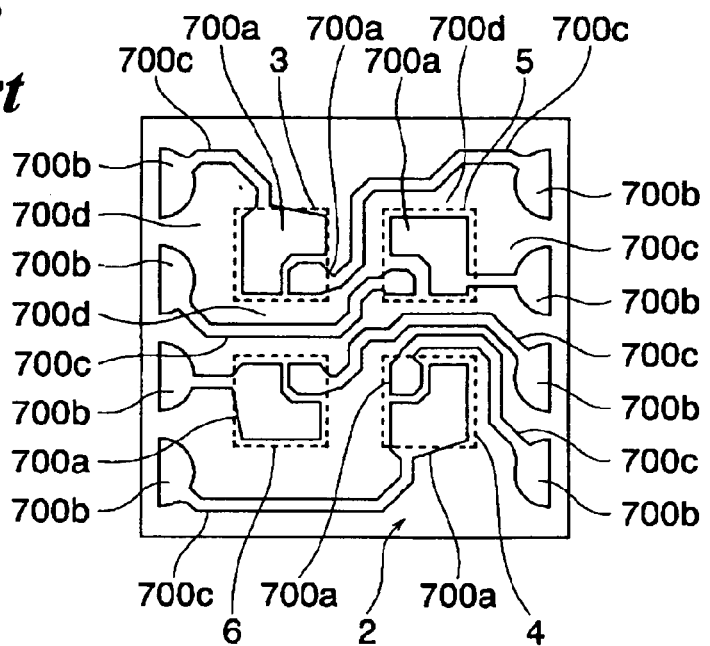
FIG. 3B is a plan view of a wiring pattern formed on a silicon submount of a semiconductor light-emitting device of the related art.

FIGS. 1A and 1B, and FIG. 2 are perspective views and a side view of a semiconductor light-emitting device of this embodiment, respectively. FIG. 3A is a plan view of a wiring pattern formed on a silicon submount of the semiconductor light-emitting device of this embodiment. FIG. 3B is a plan view of a wiring pattern formed on a silicon submount of a semiconductor light-emitting device of the related art. FIGS. 3A and 3B demonstrate a result of comparing the wiring pattern on the silicon submount of this embodiment with that of the related art.

Figure 4:
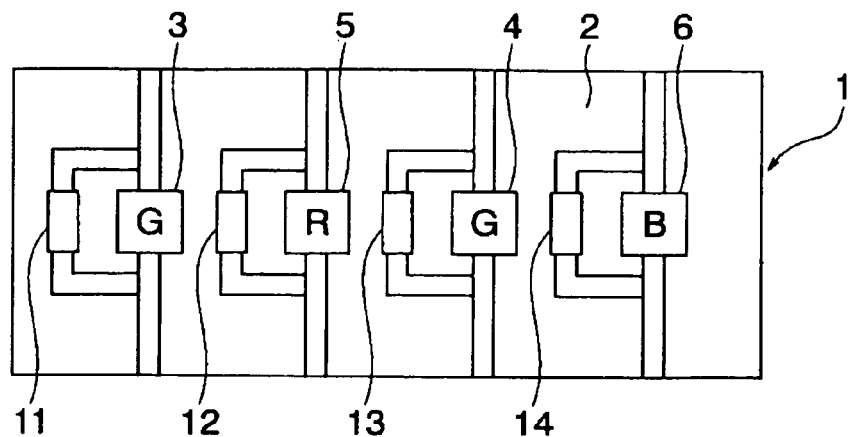
FIG. 4 is a plan view of a first modified example of the semiconductor light-emitting device according to the embodiment of the present invention.
Figure 5:
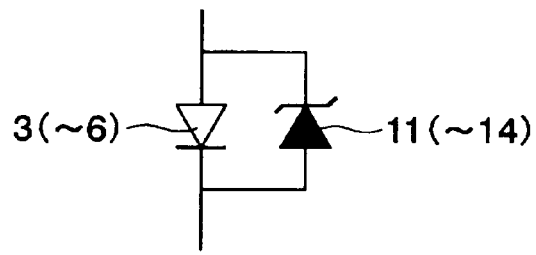
FIG. 5 shows an equivalent circuit of the first modified example of the semiconductor light-emitting device.
Figure 6:
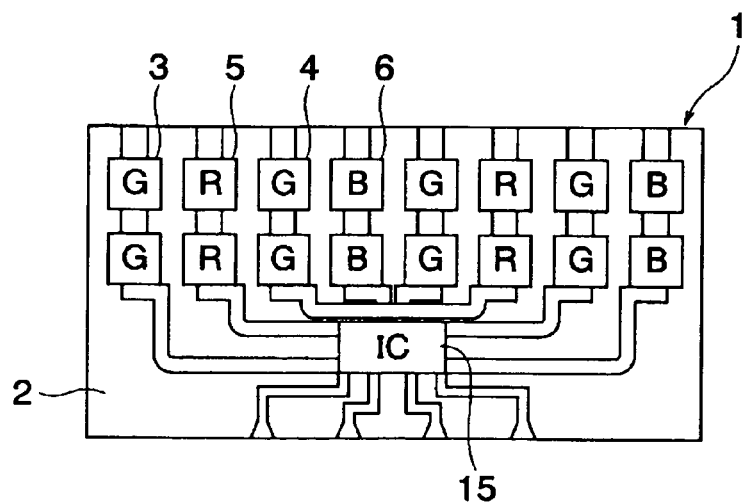
FIG. 6 is a plan view of a second modified example of the semiconductor light-emitting device according to the embodiment of the present invention.
Figure 7:
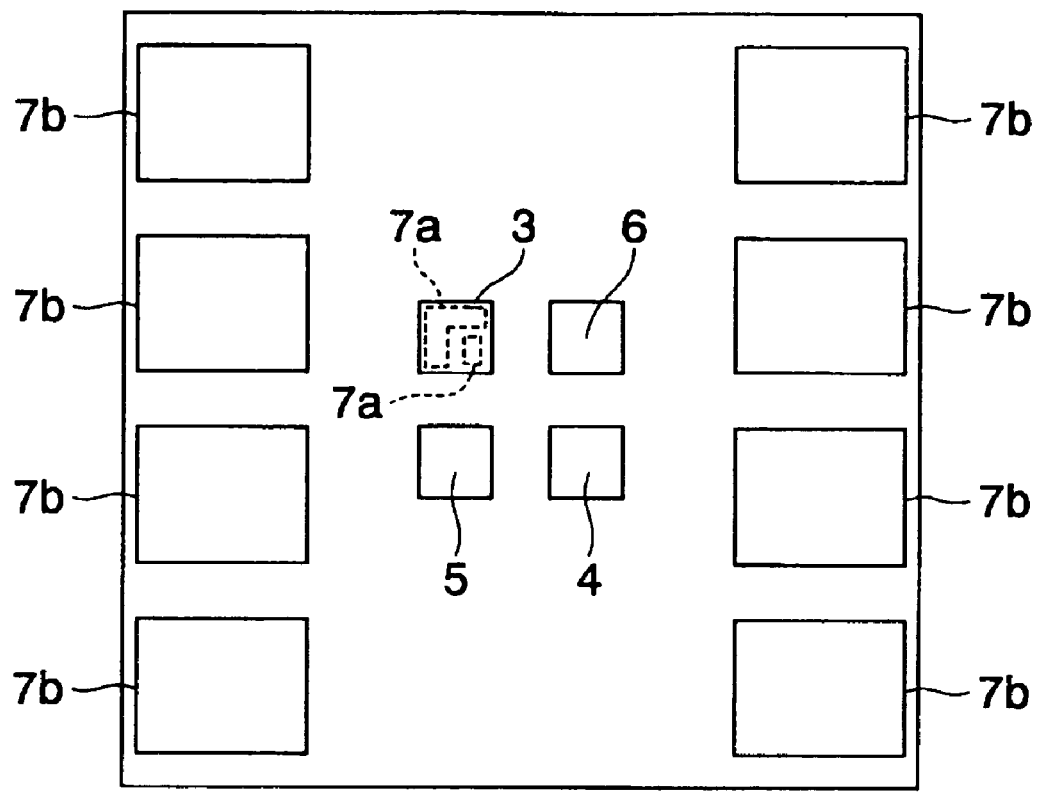
FIG. 7 is a plan view of a third modified example of the semiconductor light-emitting device according to the embodiment of the present invention.

FIG. 4 is a plan view of a first modified example of the semiconductor light-emitting device of this embodiment. FIG. 5 shows an equivalent circuit of the first modified example of the semiconductor light-emitting device of this embodiment. FIGS. 6 and 7 are plan views of a second modified example and a third modified example of the semiconductor light-emitting device of this embodiment, respectively.

As shown in FIGS. 1A and 1B, a semiconductor light-emitting device 1 of this embodiment includes a silicon submount 2 and four chip LEDs 3, 4, 5, and 6. The four chip LEDs 3, 4, 5, and 6 are mounted onto the silicon submount 2. In FIG. 1A, the four chip LEDs 3, 4, 5, and 6 are arranged in 2*2 matrix. In FIG. 1B, the four chip LEDs 3, 4, 5, and 6 are arranged in line.

As shown in FIG. 2, the silicon submount 2, an insulating oxide layer 2b is almost uniformly formed on the surface including at least a mounting surface 2a for the chip LEDs 3, 4, 5, and 6. Wiring patterns 7 are formed on the oxide layer 2b in accordance with a predetermined array.

As shown in FIG. 3A, the wiring pattern 7 includes a chip connecting terminal portion 7a, an external connecting terminal portion 7b, a lead portion 7c, and a space 7d. Here, the two chip connecting terminal portions 7a are paired, and four pairs of chip connecting terminal portions 7a (8 portions in total) are provided to connect between the chip LEDs 3, 4, 5, and 6. The number of external connecting terminal portions 7b corresponds to the number of chip connecting terminal portions 7a, and the external connecting terminal portions 7b are connected with an external unit (not shown). The lead portion 7c is provided in plural to connect a corresponding one of the chip connecting terminal portions 7a with a corresponding one of the external connecting terminal portions 7b.

The groove-like space 7d has substantially uniform width, and is defined between the two adjacent chip connecting terminal portions 7a. The two adjacent chip connecting terminal portions 7a are partitioned off by the groove-like space 7d. The space 7d is formed also between the chip connecting terminal portion 7a and the lead portion 7c, and between the two lead portions 7c. The chip connecting terminal portion 7a and the lead portion 7c are partitioned off by the groove-like space 7d. The two lead portions 7c are also partitioned off by the groove-like space 7d.

As apparent from FIG. 3A, the wiring pattern 7 of this embodiment is formed such that the width of the widest portion of each space 7d is equal to or smaller than the width of the narrowest portion of the lead portion 7c. Further, as shown in FIG. 3A, the total area of a pair of chip connecting terminal portions 7a provided for each of the chip LEDs 3, 4, 5, and 6 is larger than an area of an overlap region of the chip connecting terminal portion 7a and the chip LEDs 3, 4, 5, and 6.

Incidentally, the wiring pattern 7 is desirably formed of a copper-plated product. If so, a generated heat amount can be minimized even when a conductivity is high and a large amount of current flows. Further, it is preferable to form a metal layer, a tin layer, or a solder layer on a predetermined surface portion of the wiring pattern 7. If such layer is formed, the chip LEDs 3, 4, 5, and 6 can be easily connected with the external unit.

FIG. 3B shows an example of a wiring pattern 700 formed on the silicon submount in the related art. In FIG. 3B, the chip connecting terminal portions 700a, the external connecting terminal portions 700b, and the lead portions 700c as many as the wiring patterns 7 of this embodiment are formed.

The shape and dimension of the chip connecting terminal portion 700a are substantially the same as those of a terminal portion formed in each of the chip LEDs 3, 4, 5, and 6 connected with the portion 700a. Meanwhile, the external connecting terminal portion 700b is formed into a planar shape of the optimum dimension that facilitates the connection with the external unit with high accuracy similar to the external connecting terminal portion 7b of this embodiment. The lead portion 700c is formed into a linear shape of the optimum dimension that enables a high resistance and facilitates laying of lines.

As apparent from the comparison between FIGS. 3A and 3B, in the related art, the width of the widest portion of each space 700d between the adjacent chip connecting terminal portion 700a and lead portion 700c is not always equal to or smaller than the width of the narrowest portion of the lead portion 700c unlike this embodiment. The width of the space 700d is larger than the width of the narrowest portion of the lead portion 700c. The related art and this embodiment also differ in terms of the width of the space between the two lead portions 700c.

Incidentally, the wiring pattern 700 desirably formed of a copper-plated product. If so, a generated heat amount can be minimized even when a conductivity is high and a large amount of current flows. Further, it is preferable to form a metal layer, a tin layer, or a solder layer on a predetermined surface portion of the wiring pattern 700. If such layer is formed, the chip LEDs 3, 4, 5, and 6 can be easily connected with the external unit.

As shown in FIG. 3A, substantially the entire upper surface of the silicon submount 2 of this embodiment is covered with the wiring pattern 7. As mentioned above, the wiring pattern 7 is made of a metal material of high conductivity and heat conductivity such as copper. Thus, the wiring pattern 7 functions as a heat radiating member of the upper surface of the silicon submount. Further, as compared with the silicon submount 200 of the related art as shown in FIG. 3B, the heat radiation property of the upper surface of the silicon submount 2 can be improved to decrease and uniformize the temperature of the silicon submount. Accordingly, it is possible to efficiently suppress or avoid various kinds of defects resulting from the overheating of the chip LEDs 3 to 6, such as deteriorations in characteristics.

Further, in the semiconductor light-emitting device 1 of this embodiment, the chip connecting terminal portion 7a is enlarged to form a desired wiring pattern 7. Thus, restrictions on a positioning accuracy of the chip LEDs 3 to 6 relative to the chip connecting terminal portion 7a can be eased to some extent. This leads to improvements in productivity of the semiconductor device and in turn to reduction in cost of the semiconductor device.

As the chip LEDs 3, 4, 5, and 6, any chip LEDs may be used in combination. A light emitting efficiency of a green LED is lower than those of a red LED and a blue LED. With this point in view, in the case where white light is generated through color mixture, two green LEDs, one red LED, and one blue LED are desirably used.

Incidentally, as shown in FIG. 1A, the four chip LEDs 3 to 6 can be arranged in 2×2 matrix. In this case, it is particularly preferable to diagonally arrange the two green LEDs 3 and 4 for increasing uniformity of the color mixture.

Further, as shown in FIG. 1B, the four chip LEDs 3 to 6 can be arranged in line. In this case as well, it is particularly preferable to arrange one green LED 3 between the red LED 5 and the blue LED 6 and arrange another green LED 4 on the outer side of the red LED 5 or the blue LED 6.

As shown in FIG. 2, a terminal portion 3a is formed on the rear surface (surface opposite to the light emitting surface) of each of the chip LEDs 3 to 6. Thus, the chip LEDs 3 to 6 can be readily connected with the chip connecting terminal portion 7a in the silicon submount 2. Further, a bonding metal layer, tin layer, or solder layer is formed in a predetermined surface portion of the terminal portion 3a.

The chip LEDs 3 to 6 are mounted to the silicon submount 2 through flip-chip bonding. Incidentally, the number of chip LEDs or a combination thereof is not limited to the above but may be arbitrarily set.

Further, the chip LEDs 3 to 6 as the semiconductor chip are mounted to the silicon submount 2. In this case, as shown in FIGS. 4 and 5, in addition to the chip LEDs 3 to 6, protective circuit elements 11, 12, 13, and 14 of the chip LEDs 3 to 6 may be mounted. As the protective circuit elements 11 to 14, a zener diode as shown in FIG. 5 or other such diodes or circuit elements having a characteristic of absorbing surge can be used.

In this way, the chip LEDs 3 to 6 and the protective circuit elements 11 to 14 of the chip LEDs 3 to 6 are mounted onto the silicon submount 2. Thus, components of the semiconductor light-emitting device can be integrated. This enables a compact and high-performance semiconductor light-emitting device. In addition, the chip LEDs 3 to 6 can be protected against the electrostatic breakdown or the like, and a reliability of the semiconductor light-emitting device can be enhanced.

Further, the chip LEDs 3 to 6 as the semiconductor chip are mounted onto the silicon submount 2. In this case, as shown in FIG. 6, in addition to the chip LEDs 3 to 6, driving circuit elements 15 for the chip LEDs 3 to 6 may be mounted. As the driving circuit element 15, an IC chip can be used.

In this way, the chip LEDs 3 to 6 and the driving circuit elements 15 for the chip LEDs 3 to 6 are mounted onto the silicon submount 2. Thus, the components of the semiconductor light-emitting device can be integrated. This enables a compact and high-performance semiconductor light-emitting device.

Incidentally, the chip LEDs 3 to 6, the protective circuit elements 11 to 14 of the chip LEDs 3 to 6, and the driving circuit elements 15 for the chip LEDs 3 to 6 can be of course collectively mounted onto the silicon submount 2.

Further, in this embodiment, as understood from the comparison between FIGS. 3 and 4, the chip connecting terminal portion 7a is enlarged to form a desired wiring pattern 7. In place of such configuration, as schematically shown in FIG. 7, the external connecting terminal portion 7b may be enlarged to form a desired wiring pattern 7. In this case, restrictions on the positioning accuracy of the terminal portion of the external unit relative to the external connecting terminal portion 7b can be eased to some extent. Hence, this leads to improvements in productivity of an electronic apparatus including the semiconductor device and the external unit and in turn to reduction in cost of the electronic apparatus.

In the semiconductor light-emitting device 1 of this embodiment, the wiring pattern 7 is formed on the silicon submount 2. The wiring pattern 7 includes the chip connecting terminal portion 7a and the external connecting terminal portion 7b, and the lead portion 7c for connecting between the terminal portions 7a and 7b. In addition, the groove-like space 7d of substantially uniform width is formed between the two adjacent chip connecting terminal portions 7a, between the chip connecting terminal portion 7a and the lead portion 7c, and the two lead portions 7c. The width of the widest portion of each space 7d is equal to or smaller than the width of the narrowest portion of the lead portion 7c.

Further, the total area of a pair of chip connecting terminal portions 7a provided for each of the chip LEDs 3, 4, 5, and 6 is larger than an area of an overlap region of the chip connecting terminal portion 7a and the chip LEDs 3, 4, 5, and 6. Hence, it is possible to increase an amount of heat released from the upper surface of the silicon submount 2. Moreover, it is possible to efficiently suppress or avoid various kinds of defects resulting from the overheating of the chip LEDs 3 to 6, such as deteriorations in characteristics.

Here, the heat radiation efficiency of the wiring pattern 7 of the semiconductor device of the present invention as shown in FIG. 3A is compared with that of the wiring pattern 700 of the semiconductor device of the related art as shown in FIG. 3B.

As the silicon submount 2, a rectangular substrate measuring 1.5 mm*1.5 mm is used. In the semiconductor device of the related art, an area of the wiring pattern 700 is set to 3.18 mm$^2$ (35% of an area of the silicon submount 2). In the semiconductor device of the related art, an area of the other portion than the wiring pattern 700 is set to 5.82 mm$^2$ (65% of an area of the silicon submount 2).

In contrast, in the semiconductor device of the present invention, an area of the wiring pattern 7 is set to 5.6 mm$^2$ (67% of an area of the silicon submount 2). Further, in the semiconductor device of the present invention, an area of the other portion than the wiring pattern 7 is set to 3.4 mm$^2$ (33% of an area of the silicon submount 2).

If a power of 2.02 W is supplied to both of the semiconductor devices, while the temperature of the semiconductor device of the related art is increased to 49.53° C., the temperature of the semiconductor device of the present invention is increased to no more than 44.67° C. Provided that a reference temperature is 25° C., a temperature rise per unit power is $(49.53-25)/2.02=12.14$ (° C./W) in the semiconductor device of the related art but is $(44.67-25)/2.02=9.74$ (° C./W) in the semiconductor device of the present invention. As understood from the above, the temperature rise per unit power can be reduced by only about 2.4 (° C./W), with the result that the heat radiation efficiency can be enhanced by about 20%.

Hereinafter, a method of manufacturing the semiconductor light-emitting device of this embodiment is described with reference to FIGS. 8A to 8E. FIGS. 8A to 8E are flowcharts of a manufacturing process of the semiconductor light-emitting device of this embodiment.

Figure 8A:
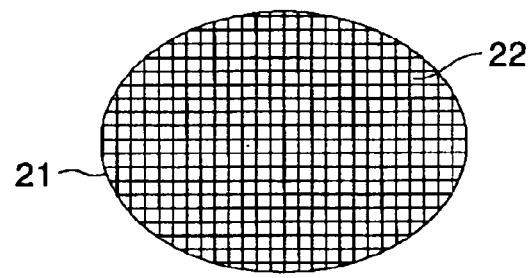
FIG. 8A is a flowchart of a manufacturing procedure of the semiconductor light-emitting device according to the embodiment of the present invention.

First, as shown in FIG. 8A, a silicon wafer 21 having a size enough to produce plural semiconductor light-emitting devices of a desired size (for example, 3 mm per side) is prepared. Incidentally, in FIG. 8A, reference numeral 22 denotes an intended scribe line. Next, the surface of the silicon wafer 21 is subjected to thermal oxidation.

Figure 8B:
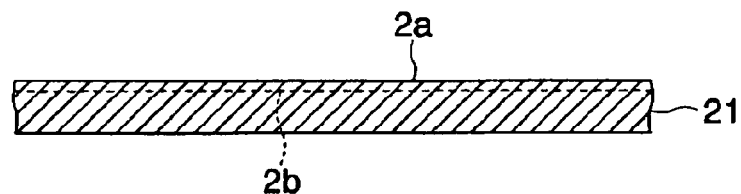
FIG. 8B is a flowchart of a manufacturing procedure of the semiconductor light-emitting device according to the embodiment of the present invention.
Figure 8C:
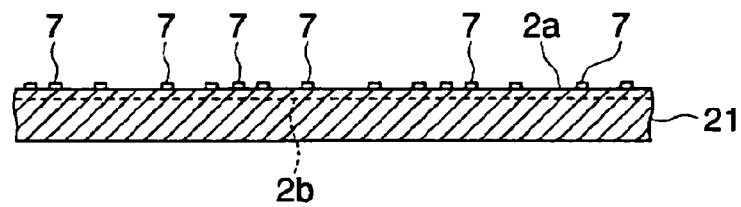
FIG. 8C is a flowchart of a manufacturing procedure of the semiconductor light-emitting device according to the embodiment of the present invention.

As shown in FIG. 8B, the insulating oxide layer 2b is formed on the thermal-oxidized surface of the silicon wafer 21. Next, as shown in FIG. 8C, a desired wiring pattern 7 including the chip connecting terminal portion 7a, the external connecting terminal portion 7b, and the lead portion 7c is formed on the thermal-oxidized surface of the silicon wafer 21 through, for example, a photoresist method.

Figure 8D:
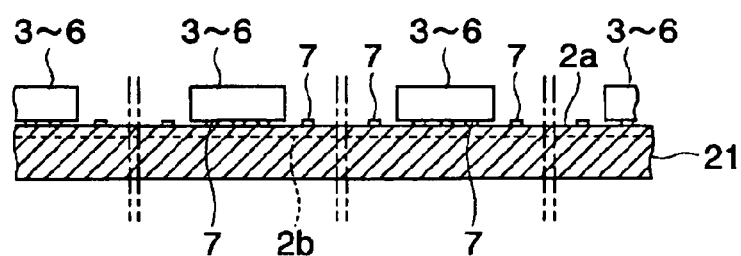
FIG. 8D is a flowchart of a manufacturing procedure of the semiconductor light-emitting device according to the embodiment of the present invention.
Figure 8E:
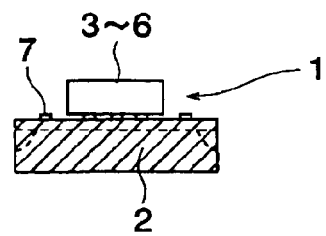
FIG. 8E is a flowchart of a manufacturing procedure of the semiconductor light-emitting device according to the embodiment of the present invention.

Next, as shown in FIG. 8D, the chip LEDs 3 to 6 are mounted on the chip connecting terminal portion 7a formed on the silicon wafer 21 through the flip-chip bonding. The chip connecting terminal portion 7a can be connected with the chip LEDs 3 to 6 through diffused bonding of metal layers with ultrasonic wave or reflow soldering. Finally, as shown in FIG. 8E, the silicon wafer 21 is scribed along the intended scribe line 22 into plural pieces as the semiconductor light-emitting device 1.

In the method of manufacturing the semiconductor light-emitting device 1 of this embodiment, the insulating oxide layer 2b is formed on the silicon wafer 21 surface through thermal oxidation. In this regard, the method of manufacturing the semiconductor light-emitting device 1 of this embodiment covers the silicon wafer 21 surface with an insulating material, so this method is different from the method of forming the insulating layer. Therefore, according to the present invention, it is possible to avoid such a situation that the insulating layer peels off from the silicon wafer 21. Hence, a high-durability semiconductor light-emitting device can be manufactured.

Further, in the method of manufacturing the semiconductor light-emitting device 1 of this embodiment, the thermal oxidation, the formation of the wiring pattern 7, and mounting of the chip LEDs 3 to 6 are executed at the wafer stage. With this regard, the method of manufacturing the semiconductor light-emitting device 1 of this embodiment is different from the method of scribing the silicon wafer 21 into pieces and then processing the pieces. Therefore, according to the present invention, the desired semiconductor light-emitting device 1 can be more efficiently manufactured than the above example. Thus, it is possible to reduce a cost of the semiconductor light-emitting device 1.

Next, a semiconductor module example utilizing the semiconductor light-emitting device of this embodiment is described with reference to FIGS. 9 to 12, 13A, and 13B. The following description is directed to a semiconductor module for illuminator use as a preferred embodiment thereof by way of example.

Figure 9:
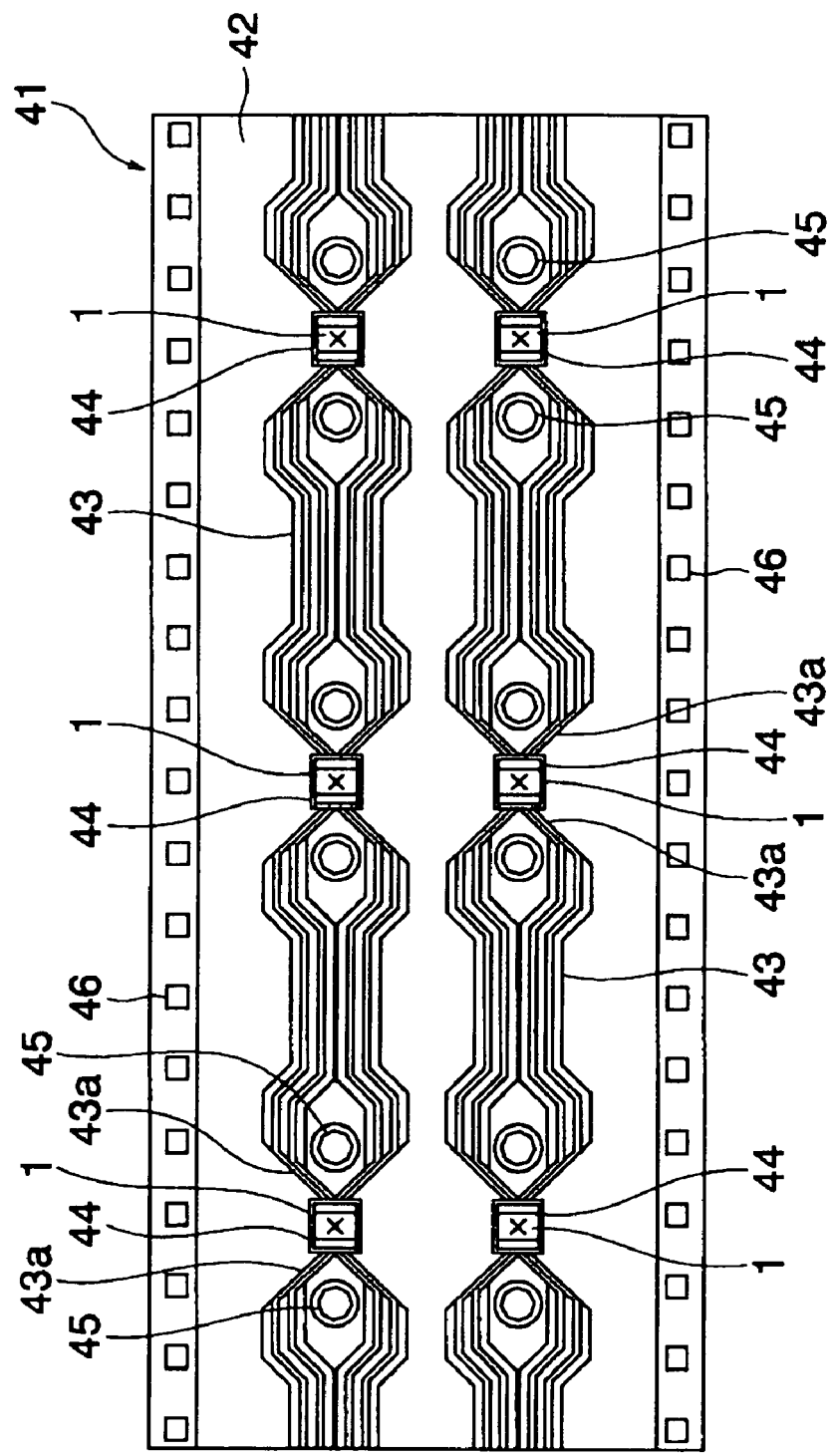
FIG. 9 is a partial plan view of a semiconductor module utilizing the semiconductor light-emitting device according to the embodiment of the present invention.
Figure 10:
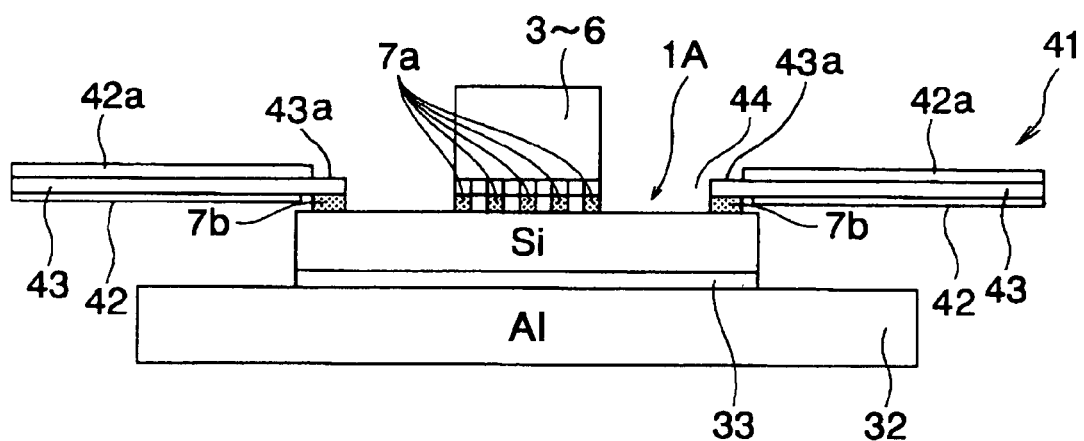
FIG. 10 is a sectional view of a main part of the semiconductor module utilizing the semiconductor light-emitting device according to the embodiment of the present invention.
Figure 11:
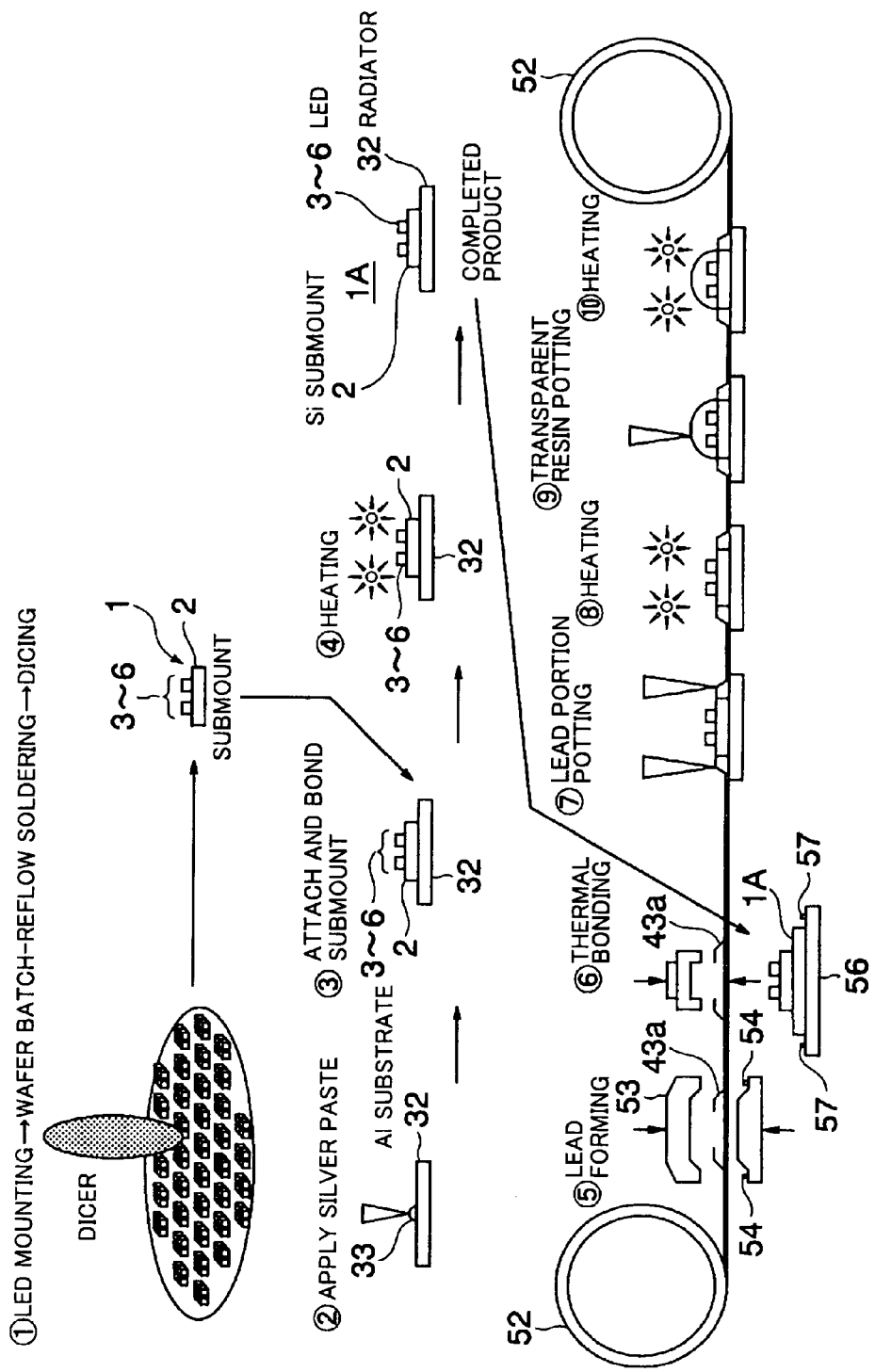
FIG. 11 is a flowchart of a manufacturing procedure of the semiconductor module utilizing the semiconductor light-emitting device according to the embodiment of the present invention.

FIGS. 9 and 10 are a partial plan view and a partial sectional view of the semiconductor module of this embodiment, respectively. FIG. 11 is a flowchart of a manufacturing procedure of the semiconductor module of this embodiment.

Figure 12:
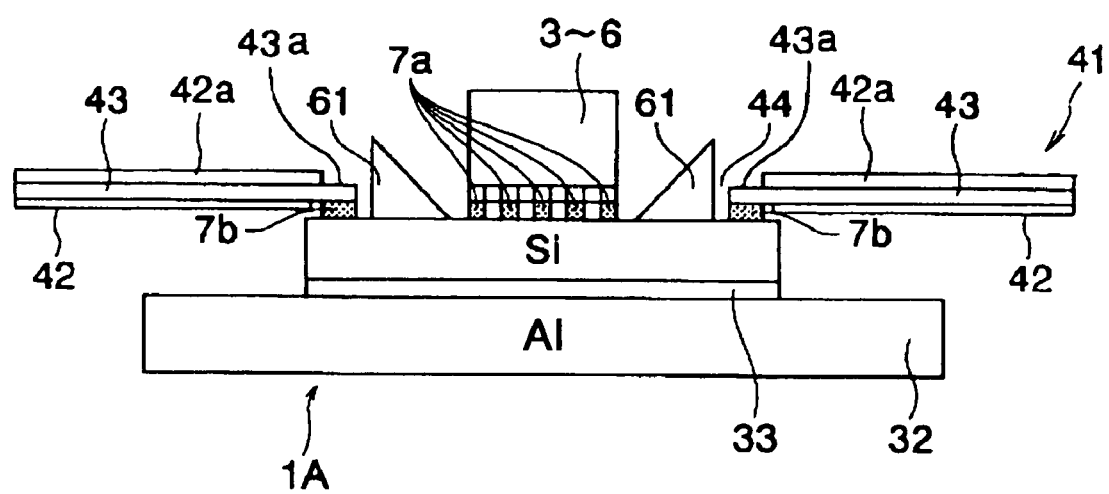
FIG. 12 is a sectional view of a main part of another semiconductor module utilizing the semiconductor light-emitting device according to the embodiment of the present invention.

FIG. 12 is a sectional view of a main part of another example of the semiconductor module of this embodiment. FIGS. 13A and 13B are side views of the mirror structure in the semiconductor module of FIG. 12.

As shown in FIGS. 9 and 10, an illuminator-use semiconductor module 31 of this embodiment includes the aforementioned semiconductor light-emitting device 1, a radiator plate 32, and a flexible wiring board 41.

The same components as those of FIG. 2 are denoted by identical reference numerals, and description thereof is omitted here.

The radiator plate 32 is generally called metal substrate provided on the rear surface of the semiconductor light-emitting device 1. In this specification, the radiator plate 32 is also referred to as the metal substrate 32. The metal substrate (radiator plate) 32 functions as a heat radiator or reinforcing member of the semiconductor light-emitting device 1. The metal substrate 32 is formed of a metal material having a high heat conductivity such as aluminum or copper. The metal substrate 32 is bonded to the rear surface of the semiconductor light-emitting device 1 by use of an adhesive 33. Accordingly, the metal substrate 32 is bonded to the rear surface of the silicon submount 2 by use of the adhesive 33. Here, the adhesive 33 may be, for example, a material of a high heat conductivity such as silver paste.

The flexible wiring board 41 is a tape-like wiring board on which the plural semiconductor light-emitting devices 1 are mounted. As shown in FIGS. 9, 10, and 12, in the flexible wiring board 41, a conductive pattern 43 is formed on a tape-like substrate 42, and a cover coat 42a is formed on the conductive pattern 43.

The tape-like substrate 42 is formed of, for example, a resin material excelling in a heat resistance, stiffness, and an insulating property, such as a polyimide resin or a polyamide resin. The conductive patterns 43 are made up of a copper foil or the like, and formed on the tape-like substrate 42 with a predetermined array. The cover coat 42a has the insulating property, and covers the outer surface of the conductive pattern 43.

A lead 43a of the conductive pattern 43 is formed opposite to a semiconductor device mounting hole 44. The lead 43a is formed with such a shape and array as to be connected with the external connecting terminal portion 7b formed on the silicon submount 2 of the semiconductor light-emitting device 1.

Working holes 44, 45, and 46 are formed in predetermined positions of the flexible wiring board 41 in accordance with a predetermined arrangement. The holes 44 are mounting holes for the semiconductor light-emitting device 1, and are formed at regular pitches along the longitudinal direction of the flexible wiring board 41.

The hole 45 is a positioning hole of the semiconductor device mounting hole 44 relative to a supplying device (not shown) of the semiconductor light-emitting device 1. The holes 45 are formed in predetermined positions ahead of and behind the semiconductor device mounting holes 44 at regular pitches.

The hole 46 is a feed hole of the flexible wiring board 41. The holes 46 are formed on both sides of the flexible wiring board 41 along its longitudinal direction at regular pitches. The feed hole 46 is engaged with gear teeth of a sprocket (not shown) provided in a manufacturing apparatus for the illuminator.

Incidentally, in FIG. 9, the wiring pattern 43 and the holes 44, 45, and 46 are arrayed in two lines along the longitudinal direction of the flexible wiring board 41 in parallel to each other. The number of lines of the conductive pattern 43 and the holes 44, 45, and 46 in the flexible wiring board 41 is not limited thereto but may be of course 1 or 3 or more lines. Further, the flexible wiring board 41 includes a TCP (Tape Carrier Package), a COF (Chip on Film), and other such structures.

In the semiconductor light-emitting device 1, as shown in FIG. 10, the LED is inserted into the mounting hole 44 from the lower side of the flexible wiring board 41. At this time, at least the light emitting surface of the chip LEDs 3 to 6 protrudes from the upper surface of the flexible wiring board 41.

The external connecting terminal portion 7b formed on the silicon submount 2 is connected with the lead 43a of the flexible wiring board 41. The method of connecting the external connecting terminal portion 7b with the lead 43a may be thermal-bonding, ultrasonic bonding, soldering, or wire bonding.

Incidentally, in the illustrated example of FIG. 10, the semiconductor light-emitting device 1 contacts the flexible wiring board 41 only at the external connecting terminal portion 7b. The present invention is not limited thereto, and the upper surface of the metal substrate 32 in the semiconductor light-emitting device 1 can be bonded to the lower surface of the flexible wiring board 41. Therefore, a stability in attaching the semiconductor light-emitting device 1 to the flexible wiring board 41 can be enhanced.

The semiconductor module is manufactured in accordance with a procedure of FIG. 11.

To be specific, the semiconductor light-emitting device 1 is first manufactured in accordance with the procedure of FIGS. 8A to 8E. At the same time, the metal substrate 32 and the flexible wiring board 41 are prepared. The flexible wiring board 41 is fed in the form of being wound around a reel 51.

Next, a silver paste is applied to one side of the metal substrate 32. The silicon submount 2 of the semiconductor light-emitting device 1 is placed on the silver paste-coated surface of the metal substrate 32. After that, the device is dried under heating. In this way, a bonded member 1A of the semiconductor light-emitting device 1 and the metal substrate 32 is obtained.

The bonded member 1A is placed on the flexible wiring board 41 as follows. The flexible wiring board 41 is wound off from the reel 51. One end of the flexible wiring board 41 is rewound around the take-up reel 52. The flexible wiring board 41 is successively fed from the reel 51 side to the take-up reel 52 side by use of the feed hole 46.

A lead forming apparatus 53 is pressed against both of the front and rear surfaces of the flexible wiring board 41. The lead 43a of the flexible wiring board 41 is formed into a desired shape. The lead forming apparatus 53 is positioned relative to the flexible wiring board 41 as follows. A pin-like positioning projection 54 of the lead forming apparatus 53 is inserted into a positioning hole 45 of the flexible wiring board 41.

The bonded member 1A is transferred from the lower side of the flexible wiring board 41. The chip LEDs 3 to 6 of the transferred bonded member 1A are inserted into the mounting holes 44 of the flexible wiring board 41. The external connecting terminal portion 7b on the silicon submount 2 is connected with the lead 43a on the flexible wiring board 41 by means of a desired connecting apparatus 55.

The bonded member 1A is positioned relative to the flexible wiring board 41 as follows. A pin-like positioning projection 57 of a bonded member conveying apparatus 56 is inserted into the positioning hole 45 of the flexible wiring board 41.

Finally, a potting resin is supplied to the connecting portion and dried under heating. A potting resin is supplied to the chip LEDs 3 to 6 and dried under heating. In this way, the manufacturing of the tape-like illuminator is completed.

The thus-manufactured illuminator and the semiconductor module for illuminator use are cut or connected as appropriate and then used as a dot, planar, or linear light emitting device having a predetermined number of chip LEDs 3 to 6. In the illuminator and the method of manufacturing the semiconductor module for illuminator use of this embodiment, the tape-like flexible wiring board 41 is successively taken up by the take-up reel 52 while continuously executing the following three steps: the formation of the lead 43a, the attachment of the bonded member 1A to the flexible wiring board 41, and the application of a potting resin to a predetermined portion. As a result, the illuminator can be efficiently manufactured, and a cost of the illuminator can be lowered.

Incidentally, as shows in FIG. 12, in the above illuminator, the mirror structure 61 of a desired shape may be placed in the peripheral portion of the chip LEDs 3 to 6. Thus, light emitted from the chip LEDs 3 to 6 can be efficiently applied in the direction of the normal to the silicon submount 2.

The mirror structure 61 is made up of plastic molding where a reflective layer is formed. The reflective layer or its surface portion is formed of a metal layer of a high light reflectivity or a metal material having a high light reflectivity. The mirror structure 61 is attached to the peripheral portion of the chip LEDs 3 to 6 by means of a desired adhesive.

The mirror structure 61 reflects light emitted from end faces of the chip LEDs 3 to 6 in the direction of the normal to the chip mounting surface 2a. The reflection surface may be designed as an oblique face as shown in FIG. 13A. Alternatively, the reflection surface may be designed as a concave face as shown in FIG. 13B.

In this way, the mirror structure 61 of a desired shape is provided in the peripheral portion of the chip LEDs 3 to 6. Thus, the light emitted from the end faces of the chip LEDs 3 to 6 can be reflected in the direction of the normal to the chip mounting surface 2a. In addition, the reflected light can be combined with light emitted from the surface portion of the chip LEDs 3 to 6. Therefore, the efficient use of the light is realized, and a high-luminance and power-saving illuminator can be obtained.

As described above, in the semiconductor module of the present invention, the semiconductor device is directly bounded to the flexible wiring board of high mass productivity and flexibility. Hence, it is possible to inexpensively manufacture the semiconductor module that can be elastically deformed into a desired shape based on where the module is used.

Further, the semiconductor chip is mounted onto the silicon submount the thermal expansion coefficient of which is approximate to that of the semiconductor chip. Thus, the breakdown of the semiconductor chip hardly occurs, and the semiconductor chip attains high durability.

Further, the upper surface of the semiconductor chip is positioned above the upper surface of the flexible wiring board. Therefore, in the case of adopting the LED as the semiconductor chip, a high-luminance and power-saving illuminator can be attained.

Further, the lower surface of the silicon submount is positioned below the lower surface of the flexible wiring board. Therefore, the radiator plate may be provided on the rear surface of the silicon submount. Thus, the semiconductor module of high heat radiation property can be easily manufactured.

Further, in the method of manufacturing a semiconductor module of the present invention, the semiconductor device is inserted into the semiconductor device mounting hole of the flexible wiring board. Therefore, the semiconductor device can be readily positioned relative to the flexible wiring board. Thus, it is possible to easily manufacture the semiconductor module including many semiconductor devices.

Further, the semiconductor device is inserted into the semiconductor device mounting hole from the lower side of the flexible wiring board while transferring the flexible wiring board in one direction. Moreover, the conductive pattern on the flexible wiring board is connected with the wiring pattern on the silicon submount. Therefore, the semiconductor device can be efficiently attached to the flexible wiring board. This lowers the cost of the semiconductor module.

Next, the structure of the semiconductor device having a lens on the chip LEDs 3 to 6 is described with reference to the drawings.

Figure 14:
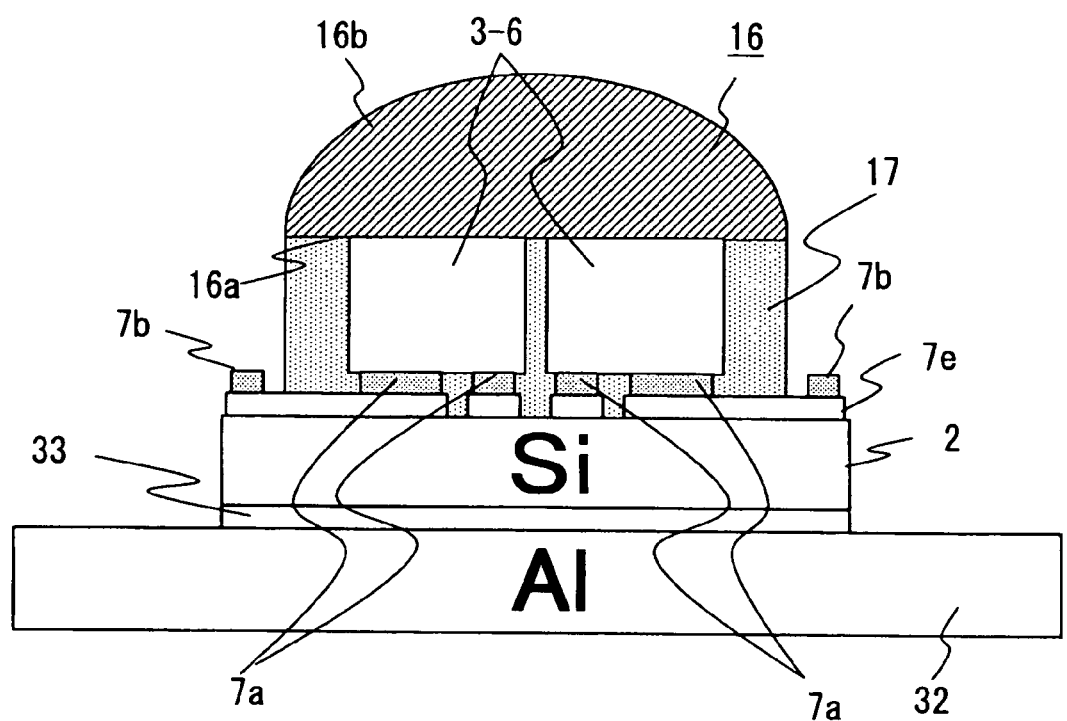
FIG. 14 is a sectional view of a semiconductor device including a lens.

FIG. 14 is a sectional view of the semiconductor device having the lens. FIG. 14 is based on FIGS. 10 and 12, and the flexible wiring board 41 of FIGS. 10 and 12 is omitted from FIG. 14 for simplicity's sake. In FIG. 14, two chip LEDs are illustrated for ease of explanation.

In FIG. 12, the mirror structure 61 is placed in the peripheral portion of the chip LEDs 3 to 6. Thus, the light emitted from the chip LEDs 3 to 6 can be efficiently guided to go away from the silicon submount 2 surface where the chip LEDs 3 to 6 is mounted, on the silicon submount 2 surface side where the chip LEDs 3 to 6 is mounted.

Meanwhile, in FIG. 14, a convex lens 16 and a transparent resin lens 17 are provided as an optical member to cover the chip LEDs 3 to 6. With this regard, the embodiment of FIG. 12 is different from the embodiment of FIG. 14.

As shown in FIG. 14, the convex lens 16 is provided on the chip LEDs 3 to 6 on the side opposite to the silicon submount 2. A surface 16a of the convex lens 16 on the silicon submount 2 side is flat. In contrast, a surface of the convex lens 16 on the opposite side of the silicon submount 2 is convex. Here, the convex lens 16 is formed of a light transmissive material.

As described above, the convex lens 16 as the optical member is provided to cover the chip LEDs 3 to 6. Therefore, it is possible to more efficiently guide the light emitted from the chip LEDs 3 to 6 so as to go away from the silicon submount surface where the chip LEDs 3 to 6 are mounted. As a result, the efficient use of the light is realized, and a high luminance and low power consumption can be attained. In this example, the direction in which the light goes away from the surface where the chip LEDs 3 to 6 are mounted is the direction toward the upper surface of the silicon submount.

As shown in FIG. 14, the surface 16a of the convex lens 16 on the silicon submount is opposite to the silicon submount surface where the chip LEDs 3 to 6 are mounted and is substantially parallel to the silicon submount surface where the chip LEDs 3 to 6 are mounted.

With this structure, the surface 16a of the convex lens 16 on the silicon submount side and the silicon submount 2 surface where the chip LEDs 3 to 6 are mounted are used as position points. Thus, the components can be assembled while aligning the position or direction of the convex lens 16, and the attachment of the convex lens 16 can be easily and accurately carried out.

Further, as shown in FIG. 14, a transparent resin material is filled in between the surface 16a of the convex lens 16 on the silicon submount side and the silicon submount 2 surface where the chips 3 to 6 are mounted. The filled transparent resin forms the transparent resin lens 17. Incidentally, the convex lens 16 is fixed to the silicon submount 2 by means of the transparent resin lens 17. The transparent resin lens 17 is filled in between the surface 16a of the convex lens 16 on the silicon submount side and the silicon submount 2 surface where the chips 3 to 6 are mounted with no space.

With such structure, the present invention apply to such a case that the plural chip LEDs 3 to 6 different in height are mounted onto the silicon submount, with ease. That is, due to the above structure, the convex lens 16 can be stably held. Incidentally, in FIG. 14, the chip connecting terminal portion 7a and the external connecting terminal portion 7b are formed on the wiring common pattern 7d.

Figure 15:
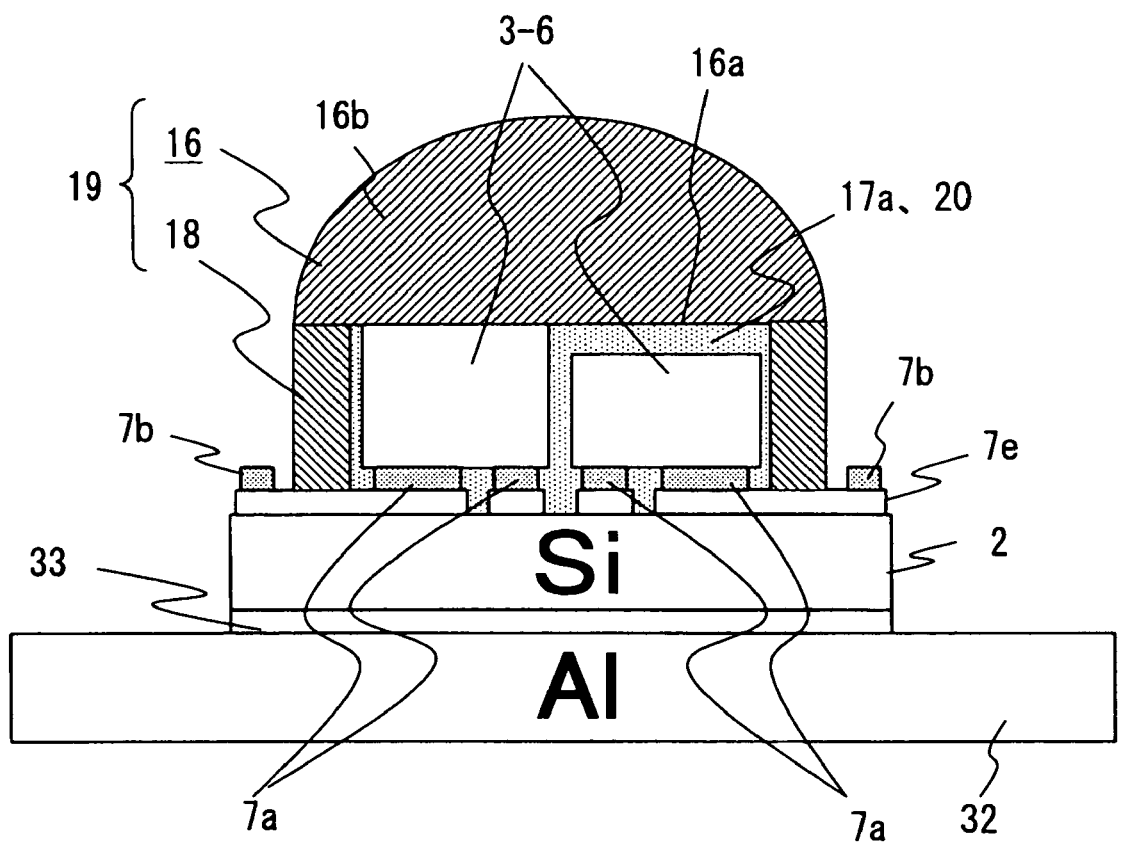
FIG. 15 is a sectional view of a modified example of the semiconductor device including a lens.
Figure 16:
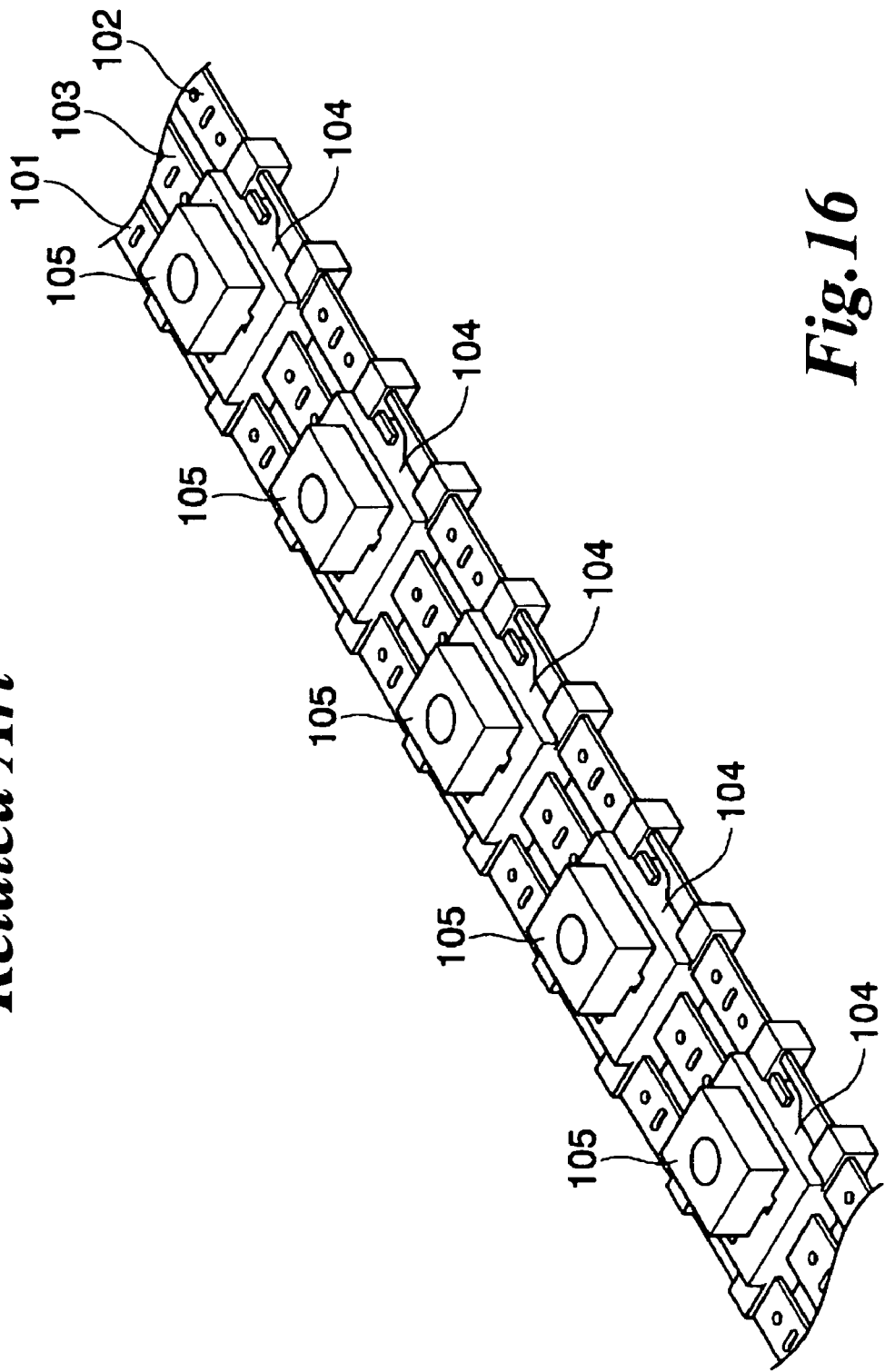
FIG. 16 is a perspective view of a semiconductor module of the related art.

Next, the structure of a modified example of the semiconductor device having a lens on the chip LEDs 3 to 6 is described with reference to the drawings. FIG. 15 is a sectional view of the modified example of the semiconductor device having a lens. FIG. 15 is based on FIGS. 10 and 12 similar to FIG. 14, and the flexible wiring board 41 of FIGS. 10 and 12 is omitted from FIG. 14 for simplicity's sake. In FIG. 15, two chip LEDs different in height are illustrated for ease of explanation.

As shown in FIG. 14, in the semiconductor device having the lens on the chip LEDs 3 to 6, the convex lens 16 and the transparent resin lens 17 as optical members are provided to cover the chip LEDs 3 to 6. Thus, the light emitted from the chip LEDs 3 to 6 can be efficiently guided to go away from the silicon submount 2 surface where the chip LEDs 3 to 6 is mounted, on the silicon submount 2 surface side where the chip LEDs 3 to 6 is mounted.

Meanwhile, as shown in FIG. 15, in the modified example of the semiconductor device having the lens on the chip LEDs 3 to 6, a cover 19 integrating the convex lens 16 and a cylindrical portion 18 as the optical member is provided to cover the chip LEDs 3 to 6. With this regard, the embodiment of FIG. 14 is different from that of FIG. 15.

Further, as shown in FIG. 15, the cover 19 includes the convex lens 16, the cylindrical portion 18, a holding portion 20, and an abutment portion 18a. The cylindrical portion 18 is formed into a cylindrical shape by use of a transparent material. Further, the cylindrical portion 18 extends from the outer peripheral portion of the surface of the convex lens 16 on the silicon submount 2 side toward the silicon submount 2 side. Incidentally, the convex lens 16 and the cylindrical portion 18 may be integrally formed through resin molding.

The holding portion 20 houses the chip LEDs 3 to 6. The holding portion 20 is surrounded by the surface of the convex lens 16 on the silicon submount side and the inner wall of the cylindrical portion 18. As shown in FIG. 15, the chip LEDs 3 to 6 different in height are mounted onto the silicon submount 2. In this case, the holding portion 20 is designed to have a size enough to receive the highest chip LED.

The abutment portion 18a is provided at the leading edge of the cylindrical portion 18. The abutment portion 18a abuts against the outer edge of the chip LEDs 3 to 6 on the silicon submount 2. Further, a transparent resin material is filled in the holding portion 20 with no space. The filled transparent resin forms the transparent resin portion 17a.

Owing to such structure, the abutment portion 18a is brought into abutment against the outer edge of the chip LEDs 3 to 6 on the silicon submount 2. Hence, plural LEDs of different heights can be mounted onto the silicon submount. In this case as well, the cover 19 can be stably mounted onto the silicon submount 2.

As set forth above, according to the present invention, it is possible to efficiently suppress or avoid various kinds of defects resulting from the overheating of the semiconductor chip.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor device, comprising:
   a silicon submount having an insulating oxide layer formed on a surface;
   a semiconductor chip mounted onto the silicon submount; and
   a predetermined wiring pattern formed on the insulating oxide layer,
   the wiring pattern including:
   a plurality of chip connecting terminal portions connecting the semiconductor chip;
   a plurality of external connecting terminal portions connecting an external unit; and
   a plurality of lead portions connecting a corresponding one of the chip connecting terminal portions and a corresponding one of the external connecting terminal portions, and
   an area of the chip connecting terminal portion is larger than an area of a region where the chip connecting terminal portions and the semiconductor chip overlap with each other.

2. The semiconductor device according to claim 1, wherein the semiconductor chip includes a terminal portion connected with the chip connecting terminal portion, and
   an outer size of the chip connecting terminal portion is larger than an outer size of the terminal portion.

3. The semiconductor device according to claim 1, wherein the wiring pattern is made up of a copper-plated product.

4. The semiconductor device according to claim 1, wherein the semiconductor chip includes at least one light emitting diode and a driving circuit element of the light emitting diode, and
   the light emitting diode and the driving circuit element are mounted onto the silicon submount.

5. The semiconductor device according to claim 1, wherein the semiconductor chip includes at least one light emitting diode and a protective circuit element of the light emitting diode, and
   the light emitting diode and the protective circuit element are mounted onto the silicon submount.

6. The semiconductor device according to claim 4, wherein the semiconductor chip includes a red light emitting diode, a green light emitting diode, and a blue light emitting diode as the light emitting diodes mounted onto the silicon submount.

7. The semiconductor device according to claim 5, wherein the semiconductor chip includes a red light emitting diode, a green light emitting diode, and a blue light emitting diode as the light emitting diodes mounted onto the silicon submount.

8. The semiconductor device according to claim 1, further comprising:
   a radiator plate attached to a rear surface of the silicon submount, and
   an area of the radiator plate is larger than an area of the silicon submount.

9. The semiconductor device according to claim 1, wherein the semiconductor chip is a light emitting diode, and an optical member is provided to cover the light emitting diode, and
   the optical member guides light emitted from the light emitting diode to go away from the silicon submount surface where the light emitting diode is mounted.

10. The semiconductor device according to claim 9, wherein the optical member is formed of a light transmissive material.

11. The semiconductor device according to claim 9, wherein the optical member includes a lens provided to the light emitting diode on the opposite side of the light emitting diode to the silicon submount,
    the lens has a flat surface on the side facing the light emitting diode, and
    the flat surface is substantially parallel to the silicon submount surface where the light emitting diode is mounted.

12. The semiconductor device according to claim 11, wherein a transparent resin is filled in between the flat surface of the lens and the silicon submount surface where the light emitting diode is mounted.

13. The semiconductor device according to claim 9, wherein the optical member includes:
    a lens provided to the light emitting diode on the opposite side of the light emitting diode to the silicon submount;
    a cylindrical member extending from an outer peripheral portion of a surface of the lens on the silicon submount side toward the silicon submount side;
    a holding portion surrounded by the surface of the lens on the silicon submount side and an inner wall of the cylindrical member and housing the light emitting diode; and
    an abutment portion provided to a leading edge of the cylindrical member and brought into abutment against an outer peripheral portion of the light emitting diode.

* * * * *